United States Patent
Peach et al.

(10) Patent No.: US 6,300,775 B1
(45) Date of Patent: Oct. 9, 2001

(54) SCATTERING PARAMETER CALIBRATION SYSTEM AND METHOD

(75) Inventors: Robert Peach, Cambridge; Nicholas Svensson; Thai Vo, both of Kitchener, all of (CA)

(73) Assignee: COM DEV Limited, Cambridge (CA)

( * ) Notice: Subject to any disclaimer, the term of this patent is extended or adjusted under 35 U.S.C. 154(b) by 0 days.

(21) Appl. No.: 09/241,704

(22) Filed: Feb. 2, 1999

(51) Int. Cl.[7] .................................................. G01R 27/28
(52) U.S. Cl. .............................. 324/601; 324/638; 702/90
(58) Field of Search ..................................... 324/601, 638, 324/76.19; 702/90

(56) References Cited

U.S. PATENT DOCUMENTS

| | | | |
|---|---|---|---|
| 4,816,767 | * 3/1989 | Cannon et al. | ................... 324/601 |
| 4,853,613 | 8/1989 | Sequeira et al. | . |
| 4,982,164 | 1/1991 | Schiek et al. | . |
| 5,313,166 | 5/1994 | Eul et al. | . |
| 5,434,511 | 7/1995 | Adamian et al. | . |
| 5,440,236 | 8/1995 | Schiek et al. | . |
| 5,442,296 | 8/1995 | Schiek et al. | . |
| 5,467,021 | 11/1995 | Adamian et al. | . |
| 5,537,046 | 7/1996 | Adamian et al. | . |
| 5,548,221 | 8/1996 | Adamian et al. | . |
| 5,552,714 | 9/1996 | Adamian et al. | . |
| 5,578,932 | 11/1996 | Adamian | . |
| 5,587,934 | 12/1996 | Oldfield et al. | . |
| 5,608,330 | 3/1997 | Heuermann et al. | . |
| 5,646,536 | 7/1997 | Ishihara | . |
| 5,661,404 | 8/1997 | Yanagawa et al. | . |
| 5,666,059 | 9/1997 | Heuermann et al. | . |
| 5,748,506 | 5/1998 | Bockelman | . |
| 5,751,153 | 5/1998 | Bockelman | . |
| 5,784,299 | 7/1998 | Evers et al. | . |
| 5,793,213 | 8/1998 | Bockelman et al. | . |

FOREIGN PATENT DOCUMENTS

| | | |
|---|---|---|
| 19828682 | 3/1999 | (DE) . |
| 2292616 | 2/1996 | (GB) . |

OTHER PUBLICATIONS

Ferrero A. et al., "A New Implementation Of A Multiport Automatic Network Analyzer", IEEE Transactions On Microwave Theory And Techniques, US, IEE Inc., New York, vol. 40, No. 11, Nov. 1, 1992, pp. 2078–2085.

"Network Analyzer Basics"; Ballo, David; Hewlett–Packard Company, 1998 Back to Basics Seminar (1997). No month available.

"An Automatic Network Analyzer System"; Hackborn, R.A.; Microwave Journal, pp. 45–52, May 1968.

"Error Models For Systems Measurement"; Fitzpatrick, J.; Microwave Journal, pp. 63–66, May 1978.

* cited by examiner

*Primary Examiner*—Safet Metjahic
*Assistant Examiner*—Vincent Q. Nguyen
(74) *Attorney, Agent, or Firm*—Jones, Day, Reavis & Pogue

(57) ABSTRACT

A system and method of calibrating an S parameter measurement instrument (such as a vector network analyzer) in which the number of calibrations required to fully characterize the error model of an n-port system is n/2 calibrations for an even number of ports and (n+1)/2 calibrations for an odd number of ports. Each test port in the system is involved in at least one full calibration, thus n/2 test paths are fully calibrated. For each measured test path, the error terms of the applicable error model are calculated. These error terms are then decoupled from the associated test path into error parameters that are localized to the individual test ports of the test path. Having localized the error parameters, the error model for each test port can then be treated independently from the other test ports. The error terms for the test paths that are not calibrated are then constructed using the localized error parameters for the individual test ports.

31 Claims, 6 Drawing Sheets

SCATTERING PARAMETER CALIBRATION SYSTEM AND METHOD

BACKGROUND OF THE INVENTION

The present invention is related to the field of scattering (or "S") parameter measurement instruments, such as a vector network analyzer (or "VNA"). In particular, a novel calibration methodology for such instruments is disclosed that minimizes the number of calibration steps required to fully calibrate the measurement instrument so that the S parameters of a multi-port device under test (or "DUT") can be accurately measured. A multi-port device is characterized by its number of ports, referred to throughout this application as n, where n is 2 or greater.

In the RF and microwave regions virtually all devices are characterized by their S (or scattering) matrices. The S matrix is composed of a plurality of S parameters. S parameters are the standard method for device characterization over a very wide range of frequencies, from less than 1 MHz to above 40 GHz. These parameters are used because they are easily determined, they provide directly relevant measures of device performance, and they are well defined for any type of device. If other device representations are required, such as impedance or admittance parameters, then these can be readily deduced from the measured S parameters.

A large number of commercial test systems are available for S parameter measurement. Such systems are generally referred to as network analyzers. These instruments fall into two classes: scalar and vector. Scalar analyzers determine the amplitudes of the S parameters only, whereas vector analyzers (or VNAs) determine both the amplitudes and the phases. Scalar analyzers are far less flexible and far less accurate than vector analyzers, and are only employed in low-grade applications where equipment cost is a driving factor. Although the present system and method is generally applicable to VNA test instruments, the teaching of this application may also apply to other types of instruments that characterize S parameters (or other equivalent measurements) for a multi-port DUT.

Commercial vector network analyzers (VNAs) are typically designed to measure two-port devices, although some one-port systems are available. These types of VNA systems include a signal generator and a combination of splitters and directional couplers that connect the two measurement ports of the VNA (Port 1 and Port 2) to its amplitude and phase detection circuitry (samplers). Typical VNAs have three or four samplers, the number of samplers affecting the accuracy and cost of the instrument.

A typical device to be characterized by such a VNA may have two or more ports, typically with coaxial or waveguide interfaces. For an n-port system the S matrix (n×n) is defined by:

$$b = Sa, \quad (1)$$

where a is an n-component vector containing the amplitudes of the waves incident on the device ports, and b is a vector containing the amplitudes of the outgoing waves. More formally, the wave amplitudes are defined by:

$$a_i = (V_i + Z_i I_i)/2, \quad (2)$$

$$b_i = (V_i - Z_i I_i)/2, \quad (3)$$

where $a_i$ is the incident voltage wave amplitude, $b_i$ is the outgoing voltage wave amplitude, $V_i$ is the voltage, $I_i$ is the input current, and $Z_i$ is the normalizing impedance, all for the i'th port under test.

The port-normalizing impedances ($Z_i$) are typically chosen to be equal to the characteristic impedances of the coaxial cables in the test system, which are 50 Ω in most cases. If a given port is terminated with its normalizing impedance (a matched load) then the incident wave amplitude at that port is identically zero (from equation (2)).

When a device is connected to the test ports of a network analyzer, a signal is applied to each device port in succession, and the reflected and transmitted waves are detected with the aid of the directional couplers. The S parameters for the device are then deduced by measuring the amplitude and phase of each of these waves relative to those of the input signal.

In practice, there are inevitable hardware imperfections in any VNA test system, which are principally related to port mismatch, coupler directivity, and instrument frequency response. Without correction, these imperfections can produce significant measurement errors. The error correction procedure now universally employed was first introduced approximately 30 years ago, and it differed from earlier techniques in that it relied on software data processing rather than hardware adjustments. This procedure is described in detail in R. A. Hackborn, *An Automatic Network Analyzer System,* Microwave Journal, pp 45–52, May 1968, and J. Fitzpatrick, *Error Models for Systems Measurement,* Microwave Journal, pp 63–66, May 1978.

The basic concept in this known procedure is to use a mathematical model of the test system, with a certain number of unknown terms (usually 12), which describe all of the main error contributions. Initially, a sequence of measurements is performed on a set of calibration components with accurately known S parameters. The values of the unknown model terms can be determined from these measurements, and the model can then be used to eliminate errors from subsequent device measurements. After correction, the device S parameters have an accuracy comparable to that of the original calibration components despite any imperfections in the test hardware.

Many DUTs have more than two electrical ports. However, they must also be measured with two-port VNAs. To accommodate the multi-port DUT with a two-port VNA, the simplest procedure is to make measurements between two ports, e.g., i and j, with the other ports terminated with accurate loads. This serves to determine the $S_{ii}$, $S_{ij}$, $S_{ji}$ and $S_{jj}$ terms in the n×n S matrix. And by repeating this procedure for all n(n−1)/2 possible pairs of ports, the full S matrix for the multi-port device can be determined.

This procedure has many disadvantages, however, such as: (1) a large number of separate measurements must be made, with the hardware being reconfigured at each stage; (2) it assumes that accurate terminations are available, which may not be true at all frequencies; and (3) reconfiguration of the hardware between measurements is impractical when components are being tested in thermal or thermal vacuum (TVAC) chambers. Because of these disadvantages, as well as others, full characterization of a multi-port device (particularly for large n) is rarely done.

For these reasons, multi-port testing often employs special programmable switch boxes, which are also commercially available. The switch box contains at least as many test ports as there are electrical ports on the DUT. Any test port on the switch box can be connected to either port of the two-port analyzer. In operation, two test ports are usually active, and are coupled to the analyzer, and the remainder are terminated in the switch box. When a device is connected to the test setup, any of the transmission paths can be measured automatically without reconfiguring the hardware. This greatly speeds up measurements, and allows testing to be performed in thermal or TVAC chambers. In such testing, only the DUT is placed in the chamber. The test equipment remains outside, and the test cables that connect the switch box to the DUT are routed into the chamber via special feedthroughs.

The use of a programmable multi-port switch box is not, however, without its problems. Every transmission path through the switch box that is used for measurements must first be calibrated. Calibrating such a large number of paths is very time consuming, and requires exceptional care on the part of the operator. The use of the wrong calibration component at any stage in this procedure will completely invalidate subsequent measurements. In addition, because the unused test ports are terminated in the switch box at the far end of the test cables, the loads presented to the DUT are relatively inaccurate. The resulting load mismatches can introduce significant errors into the S parameter measurements.

For this type of test setup, the determination of even one corrected S parameter requires the measurement of all the S parameters. For example, consider a 17-port device, i.e., n=17. For such a device, 136 two-port measurements would be required [n(n−1)/2=(17×16/2)] to determine any corrected S parameter. Making the switch box measurements is not a great problem, but calibrating the measurement system across all possible paths is extremely difficult, particularly as n becomes large, as in this example. Such a calibration task is hopelessly time consuming and error prone. In addition, this task is difficult because it is frequently necessary to use semi-rigid test cables, due to their stability, and it is not practical to make transmission measurements between all possible pairs of ports without an excessive amount of cable bending. Thus, at present, full n-port error correction is not commercially practiced.

Because of these problems, calibrating an S parameter measurement system for a multi-port DUT at present typically involves calibrations only across the test paths required for measuring the most important S parameters (typically n paths are required). This is known as a "partial" calibration. In this type of calibration, the more important S parameters are measured and the mismatch errors are simply tolerated.

Thus, there remains a general need in this field for an S parameter calibration system and method in which the number of full calibrations required to accurately characterize the S parameters for a multi-port device is reduced to a minimum.

SUMMARY OF THE INVENTION

The present invention overcomes the problems noted above and satisfies the needs in this field for a system and method of calibrating an S parameter measurement instrument (such as a vector network analyzer) in which the number of calibrations required to fully characterize the error model of an n-port system is n/2 calibrations for an even number of ports and (n+1)/2 calibrations for an odd number of ports. Each test port in the system is involved in at least one full calibration, thus n/2 test paths are fully calibrated. For each measured test path, the error terms of the applicable error model are calculated. These error terms are then decoupled from the associated test path into error parameters that are localized to the individual test ports of the test path. Having localized the error parameters, the error model for each test port can then be treated independently from the other test ports. The error terms for the test paths that are not calibrated are then constructed using the localized error parameters for the individual test ports. This calibration methodology provides a significant reduction in steps from the normal number of calibrations n(n−1)/2, and is less than that currently used for a partial calibration n.

In accordance with one aspect of the invention, a method of calibrating a scattering (S) parameter measurement system is provided to characterize a multi-port device having n ports, wherein n is greater than or equal to 2, and the measurement system has at least n test ports, the method includes the following steps: (1) selecting n/2 test port pairs by assigning each of the n test ports to at least one of the n/2 test port pairs, wherein each test port pair is characterized by an error model comprising a plurality of error terms; (2) conducting a full calibration on each of the n/2 test port pairs and storing the S parameter measurements resulting from the full calibrations in a memory associated with the S parameter measurement system; (3) calculating the error terms of the error model for each of the n/2 test port pairs using the S parameter measurements taken during the full calibrations, and storing these error terms in the memory associated with the S parameter measurement system; (4) decoupling the error terms associated with the n/2 test port pairs into error parameters that are local to the individual test ports of the test port pairs, and storing these local error parameters in the memory associated with the S parameter measurement system; and (5) constructing the error model for each of the port pairs that were not selected for full calibration in the selecting step using the local error parameters from the decoupling step, and storing these error terms in the memory associated with the S parameter measurement system.

Another aspect of the invention provides a method of calibrating an S parameter measurement system having n test ports, wherein a test path between any two test ports is characterized by an error model having a plurality of error terms, the method comprising the steps of: calibrating n/2 test paths to determine the error terms for these test paths, wherein each test port participates in at least one of the n/2 calibration test paths; decoupling the error terms associated with the n/2 test paths into error parameters that are localized to a particular test port; and constructing the error terms for the non-calibrated test paths using the local error parameters for each of the test ports.

Still another aspect of the invention provides a method of calibrating a vector network analyzer test system including a two-port vector network analyzer coupled to a 2-to-n switch matrix test set having two input ports coupled to the two ports of the vector network analyzer and n test ports, the method comprising the steps of: (a) selecting n/2 test paths for full calibration from the n(n−1)/2 possible paths through the test system, each test port participating in at least one test path, wherein each path through the test system is characterized by an error model including a plurality of error terms; (b) calibrating the n/2 test paths and measuring S parameters for these paths; (c) calculating the error terms for the n/2 test paths from the measured S parameter data; (d) decoupling the error terms from the respective n/2 test paths into error parameters that are local to one or the other of the test ports that comprise the respective test path; and (e) constructing the error terms for the non-calibrated test paths using the local error parameters for the individual test ports.

According to another aspect of the invention, an apparatus is provided that includes: an S parameter measurement system having n test ports for measuring the S parameters of a multi-port device, the S parameter measurement system having errors that must be corrected by calibration; and a calibration control system for calibrating the n(n−1)/2 possible test paths between the n test ports of the S parameter measurement system, and thus minimizing the errors, each test path being characterized by an error model having a plurality of error terms. The calibration control system includes software instructions for (1) calibrating n/2 test paths to determine the error terms for each of the paths, wherein each test port participates in at least one of the n/2 test paths; (2) decoupling the error terms associated with the calibrated test paths into error parameters that are localized to one of the test ports in the respective test path; and (3) constructing the error terms for the non-calibrated test paths using the localized error parameters for each of the test ports.

Still another aspect of the invention provides a calibration system for use with an S parameter measurement instrument having n test ports, wherein a test path between any two test ports is characterized by an error model having a plurality of error terms, the calibration system comprising: means for calibrating n/2 test paths to determine the error terms for each of the paths, wherein each test port participates in at least one calibration test path; means for decoupling the error terms associated with the calibrated test paths into localized error parameters associated with the test ports; and means for constructing the error terms for the non-calibrated test paths using the localized error parameters associated with the test ports.

In accordance with still another aspect of the invention, a method is provided for calibrating a four-sampler vector network analyzer test system having n test ports, comprising the steps of: conducting a full calibration on one test path consisting of two of the n test ports; conducting reflection calibrations only on each of the remaining n−2 test ports that did not participate in the full calibration; and constructing an error model for each of the test paths that were not fully calibrated using error data from the full calibration on the one test path and the reflection calibrations on the remaining test ports.

It should be noted that these are just some of the many aspects of the present invention. Other aspects not specifically listed will become apparent upon reading the detailed description set forth below.

The present invention overcomes the disadvantages of presently known calibration systems and methods for characterizing multi-port devices using a vector network analyzer (or other type of S parameter measurement instrument), and also provides many advantages. Not all of these advantages are simultaneously required to practice the invention as claimed, and the following list is merely illustrative of the types of benefits that may be provided, alone or in combination. These advantages include: (1) allows full calibration of an n-port instrument with at most n/2 interconnections between pairs of test ports; (2) minimizes cable bending and is compatible with rigid and semi-rigid cable systems; (3) expresses the system error parameters in terms of parameters that are local to each particular test port; (4) allows for calibration of systems with mixed connector types (i.e., coaxial and waveguide) without relying on standard adapter models or adapter removal techniques; (5) allows for full automation of the calibration process by permitting a single connection of any pair of test ports in conjunction with third party electronic calibration kits and switch matrix test sets; and (6) provides a partial calibration method for an n-port device coupled to a four-sampler VNA using only one full calibration on an arbitrarily chosen pair of test ports, and reflection calibrations on the remaining test ports.

These are just a few of the many advantages of the present invention, as described in more detail below in terms of the preferred embodiments. As will be appreciated, the invention is capable of other and different embodiments than those specifically set forth below, and its details are capable of modifications in various respects, all without departing from the spirit of the invention. Accordingly, the drawings and description of the preferred embodiments are to be regarded as illustrative in nature and not restrictive.

BRIEF DESCRIPTION OF THE DRAWINGS

The present invention satisfies the needs noted above as will become apparent from the following description when read in conjunction with the accompanying drawings wherein.

DETAILED DESCRIPTION OF THE DRAWINGS

Figure 1:
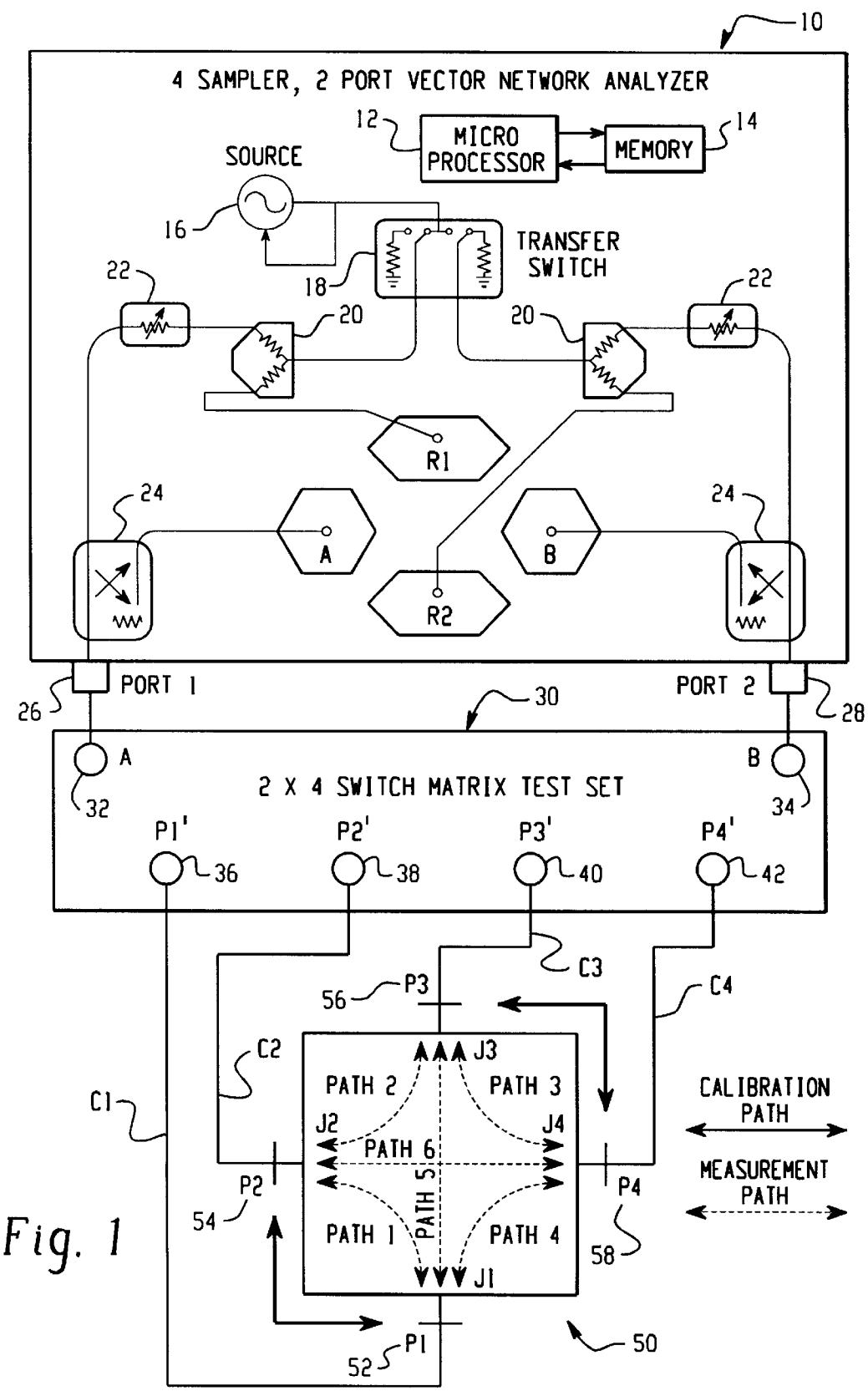
FIG. 1 is a block diagram of a preferred four-sampler, two-port vector network analyzer test system incorporating a calibration control system according to the present invention, wherein the VNA is coupled to a hypothetical four-port DUT via a switch matrix test set.

Turning now to the drawing figures, FIG. 1 sets forth a block diagram of a four-sampler, two-port vector network analyzer test system 10 incorporating a calibration control system according to the present invention, wherein the VNA 10 is coupled to a hypothetical four-port DUT 50 via a switch matrix test set 30. Note that although a four-sampler VNA 10 is shown, the present invention can be utilized with any type of vector network analyzer, or any other type of S parameter measurement system using vector error correction.

As shown in this figure, the preferred four-sampler VNA test system 10 includes a microprocessor 12 coupled to a memory 14, which together control the signal generation and measuring circuitry 16, 18, 20, 22 and 24 used to characterize the DUT 50. The microprocessor 12 could be any type of embedded microprocessor, microcontroller, DSP, ASIC, etc., as would be apparent to one of ordinary skill in this art. The memory 14 preferably contains the calibration control system of the present invention, and is preferably a permanent solid state memory, such as a flash ROM, EEPROM, ROM, etc. But, alternatively, the memory 14 could be a hard disk, floppy disk, RAM, or any other type of memory storage medium. Indeed, the memory 14 could be located external to the VNA 10 itself. For example, a PC or workstation (not shown) could be coupled to the VNA 10 using industry standard control bus structures such that the VNA 10 is controlled by the external PC or workstation. In this type of embodiment, the calibration control system could be stored in the permanent memory (i.e., hard disk, CD-ROM, etc.) of the PC or workstation, or it could be loaded from a removable memory device.

The signal generation and measuring circuitry 16, 18, 20, 22 and 24 used to characterize DUTs includes signal source generator 16, transfer switches 18, splitters 20, variable attenuators 22, couplers 24 and four samplers A, B, R1 and R2. Samplers A and B measure the reflected and transmitted waves, when power is incident on Port 1, and vice versa when power is incident on Port 2. Samplers R1 and R2 measure the incident waves on Port 1 (26) and Port 2 (28) of the VNA, respectively. The operation and control of these components will not be described in detail, as they are apparent to one of ordinary skill in the art of network analyzers. But it should be noted that the overall operation of the VNA 10 is preferably controlled by microprocessor 12, in conjunction with the calibration control system, which is preferably stored in memory 14. This calibration system and methodology are described in more detail below in connection with FIGS. 4–6. For more information regarding the general operation of vector network analyzers, refer to David Ballo, *Network Analyzer Basics,* Hewlett-Packard Company, 1998.

The VNA calibration system shown in FIG. 1 is setup in an example configuration for measuring the S parameters of a hypothetical four-port device 50. This example device will be used in discussing the preferred calibration methodology set forth below. It should be noted that this particular VNA system 10 can, of course, be used to measure the S parameters of any type of DUT with four ports or less. The example device is chosen for simplicity in explaining the concepts and benefits of the preferred methodology.

The hypothetical four-port DUT 50 includes four device ports, labeled J1, J2, J3 and J4. Interconnecting the four ports (J1–J4) are six possible paths, labeled Path 1 to Path 6. In order to provide a "full" calibration of the test system for measuring this device, all six paths must be calibrated. In the past, this would require $n(n-1)/2=6$ full calibrations (where n=4 for the four-port device.) With the methodology of the present invention, however, only $n/2=2$ full calibrations are required. This reduction in calibration steps represents a major advance over present calibration techniques for multi-port devices, and is even more pronounced for DUTs having many ports.

For example, consider another hypothetical (but commercially relevant) DUT—a 64×64 RF switch matrix. Such a device has 64 input ports and 64 output ports, for a total of 128 ports. Using the standard calibration methodology, $n(n-1)/2$ calibrations would be required, or $128(127)/2=8,128$ calibration operations. But using the present invention, only $128/2=64$ operations are required, a remarkable reduction of 8064 calibrations. Without this type of dramatic reduction in calibration steps, it would be impossible to provide full calibration on a measurement system for characterizing this type of device.

In the example test setup shown in FIG. 1, the hypothetical four-port DUT 50 is coupled to the two-port VNA 10 using a 2×4 switch matrix test set 30. The purpose of the test set 30 is to provide for automatic switching between the two ports (Port 1, Port 2) 26, 28 of the VNA 10 and the four test ports (P1–P4) 52, 54, 56 and 58, which are connected to the device ports (J1–J4) during the taking of actual S parameter measurements. The switch matrix 30 is coupled to the VNA 10 by ports A (32) and B (34) and to the DUT 50 by switch matrix ports P1' (36), P2' (38), P3' (40), and P4' (42). The switch matrix ports P1'–P4' are, in turn, coupled to the actual test ports (P1–P4), where the calibrations are conducted, via test cables C1–C4. It should be noted that the switch matrix 30 operation can be controlled by microprocessor 12, or it could be controlled by an external PC or workstation that may also be controlling the VNA 10.

Figure 2:
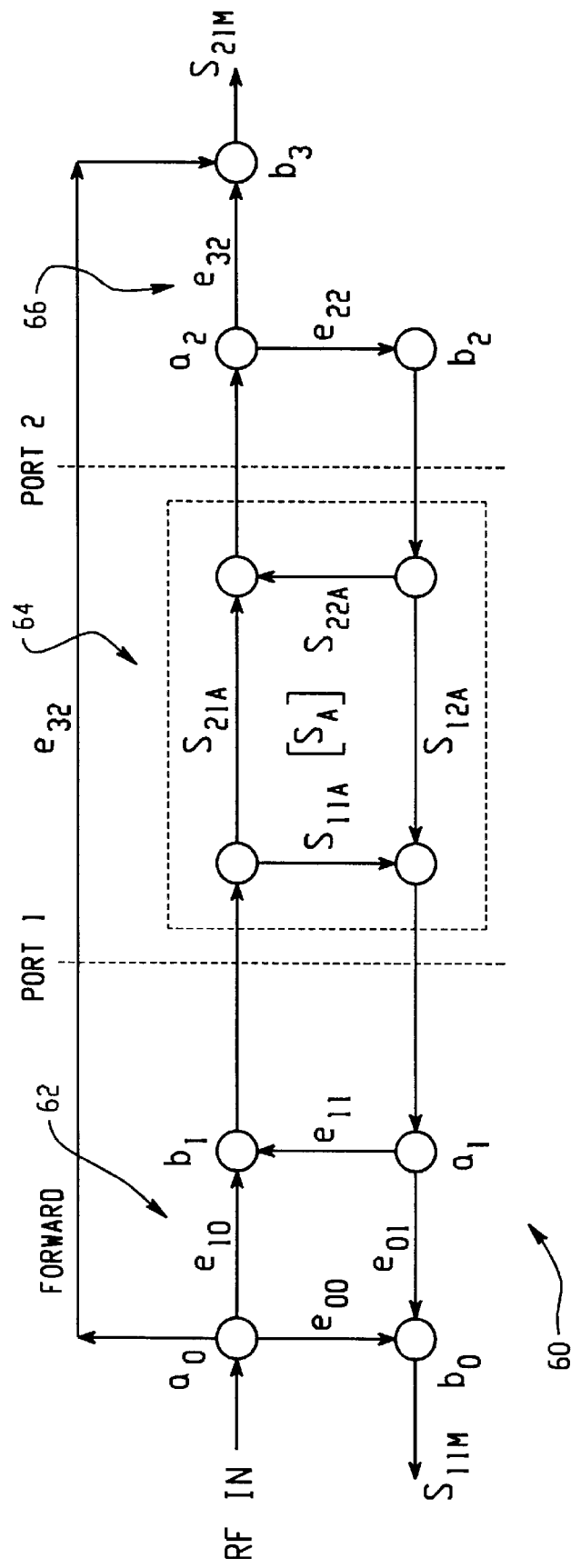
FIG. 2 is a mathematical model of the scattering matrix $S_A$ and the forward error parameters for the preferred 12-term error model, shown in signal flow-graph form.
Figure 3:
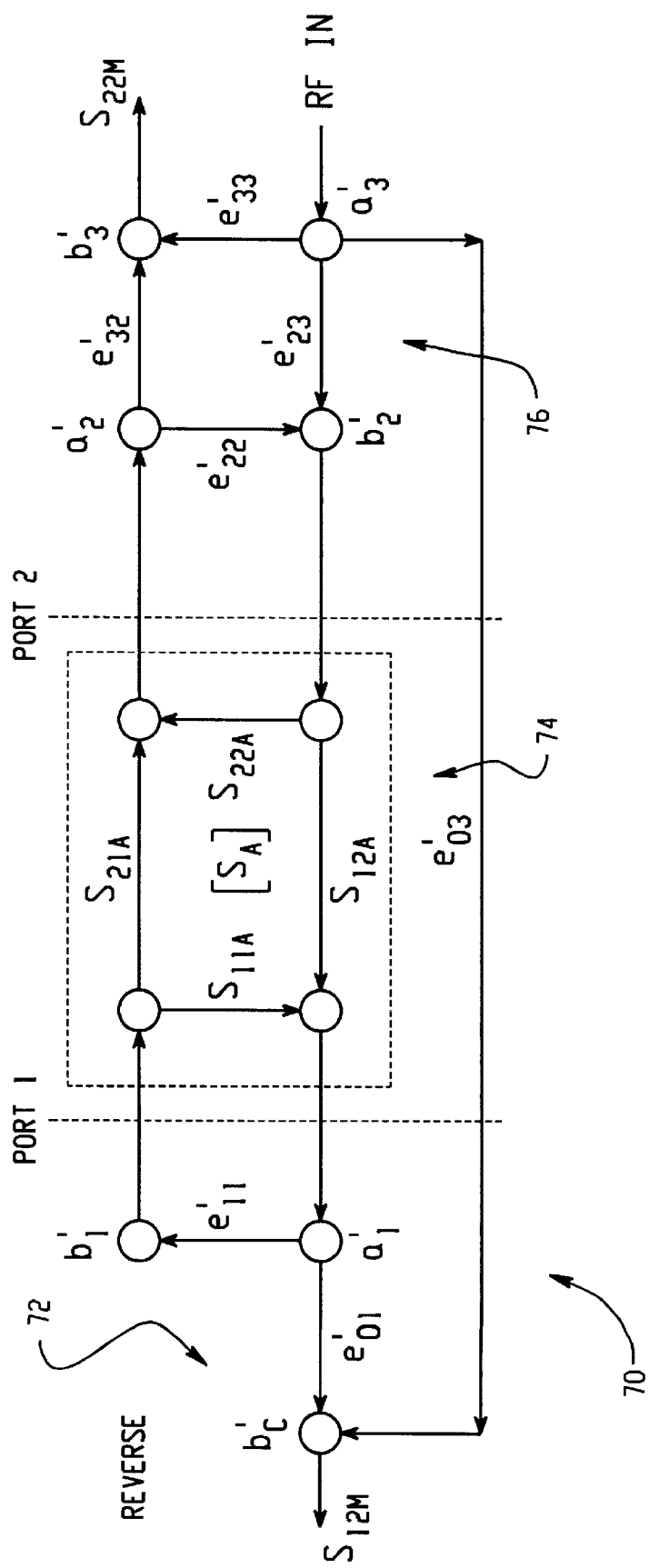
FIG. 3 is a mathematical model of the scattering matrix $S_A$ and the reverse error parameters for the preferred 12-term error model, shown in signal flow-graph form.

FIG. 2 is a mathematical model of the scattering matrix $S_A$ and the forward error parameters of the preferred 12-term error model, and FIG. 3 is the same for the reverse parameters of the 12-term error model. These figures represent the error model in signal flow graph form. Each test port path through the S parameter measurement system is characterized by two twelve-term error models, one model for each of the two senses in which the pair of test ports may be connected to Ports 1 and 2 of the analyzer. These models are based on the assumption that the wave amplitudes detected at the samplers are linear functions of the wave amplitudes at the device ports. This assumption means that non-linear effects in the instrument are not included, neither are repeatability effects associated with switches, cables and RF connectors. However, these models do accurately describe all the major error contributions in the test hardware.

In principle, 24 error terms are necessary to model a VNA with 3 samplers, and 16 for a VNA with 4 samplers. But many of these terms describe leakage components between the analyzer ports that are negligibly small and almost impossible to measure. Thus, simplified models are invariably used, that include, at most, two leakage terms. The models shown in FIGS. 2 and 3 are the most complex used in practice. Fourteen error parameters are retained in the models, though in the final equations only 12 independent error terms are required. This description of a VNA test system is therefore referred to as "the standard 12 term error model," and it is applicable to both 3 and 4 sampler VNA systems. Although the present invention is described in terms of the standard 12-term error model, the method and system disclosed are equally applicable to any other type of S parameter error model.

The forward error model 60 shown in FIG. 2 includes an input section 62, a DUT section 64 and an output section 66. The input section is composed of error parameters $e_{00}$, $e_{10}$, $e_{11}$ and $e_{01}$ coupled between nodes $a_0$, $a_1$, $b_0$ and $b_1$, an RF in signal, and a measured S component $S_{11M}$. The output section is composed of error parameters $e_{22}$ and $e_{32}$ coupled between nodes $a_2$, $b_2$ and $b_3$, and a measured S component $S_{21M}$. The DUT section is composed of the actual S parameters $S_{11A}$, $S_{12A}$, $S_{21A}$ and $S_{22A}$, and a single through leakage error parameter $e_{30}$.

Likewise, the reverse error model 70 shown in FIG. 3 includes an input section 76, a DUT section 74 and an output section 72. The input section is composed of error parameters $e'_{33}$, $e'_{23}$, $e'_{22}$ and $e'_{32}$ coupled between nodes $a'_2$, $a'_3$, $b'_2$ and $b'_3$, an RF in signal, now on the Port 2 side of the model, and a measured S component $S_{22M}$. The output section 72 is composed of error parameters $e'_{11}$ and $e'_{01}$ coupled between nodes $a'_1$, $b'_0$ and $b'_1$, and a measured S component $S_{12M}$. The DUT section is composed of the actual S parameters $S_{11A}$, $S_{12A}$, $S_{21A}$ and $S_{22A}$, and a single through leakage error parameter $e'_{03}$.

For the error models given in FIGS. 2 and 3 the measured S parameters ($S^M$) are related to the actual S parameters ($S^A$) by the equations:

$$S_{11}^M = e_{00} + (e_{10}e_{01})\frac{S_{11}^A - e_{22}|S^A|}{1 - e_{11}S_{11}^A - e_{22}S_{22}^A + e_{11}e_{22}|S^A|}, \quad (4)$$

-continued $$S_{21}^M = e_{30} + (e_{10}e_{32})\frac{S_{21}^A}{1 - e_{11}S_{11}^A - e_{22}S_{22}^A + e_{11}e_{22}|S^A|}, \quad (5)$$

$$S_{12}^M = e'_{03} + (e'_{23}e'_{01})\frac{S_{11}^A}{1 - e'_{11}S_{11}^A - e'_{22}S_{22}^A + e'_{11}e'_{22}|S^A|}, \quad (6)$$

and $$S_{22}^M = e'_{33} + (e'_{23}e'_{32})\frac{S_{22}^A - e'_{11}|S^A|}{1 - e'_{11}S_{11}^A - e'_{22}S_{22}^A + e'_{11}e'_{22}|S^A|}, \quad (7)$$

where $|S^A|$ is the determinant of the matrix $S^A$. The inverse equations are:

$$S_{11}^A = \frac{\left(\frac{S_{11}^M - e_{00}}{e_{10}e_{01}}\right)\left(1 + \frac{S_{22}^M - e'_{33}}{e'_{23}e'_{32}}e'_{22}\right) - e_{22}\left(\frac{S_{21}^M - e_{30}}{e_{10}e_{32}}\right)\left(\frac{S_{12}^M - e'_{03}}{e'_{23}e'_{01}}\right)}{D}, \quad (8)$$

$$S_{21}^A = \frac{\left(\frac{S_{21}^M - e_{30}}{e_{10}e_{32}}\right)\left(1 + \frac{S_{22}^M - e'_{33}}{e'_{23}e'_{32}}(e'_{22} - e_{22})\right)}{D}, \quad (9)$$

$$S_{12}^A = \frac{\left(\frac{S_{12}^M - e'_{03}}{e'_{23}e'_{01}}\right)\left(1 + \frac{S_{11}^M - e_{00}}{e_{10}e_{01}}(e_{11} - e'_{11})\right)}{D}, \quad (10)$$

and $$S_{22}^A = \frac{\left(\frac{S_{22}^M - e'_{33}}{e'_{23}e'_{32}}\right)\left(1 + \frac{S_{11}^M - e_{00}}{e_{10}e_{01}}e_{11}\right) - e'_{11}\left(\frac{S_{21}^M - e_{30}}{e_{10}e_{32}}\right)\left(\frac{S_{12}^M - e'_{03}}{e'_{23}e'_{01}}\right)}{D}, \quad (11)$$

where $$D = \left(1 + \frac{S_{11}^M - e_{00}}{e_{10}e_{01}}e_{11}\right)\left(1 + \frac{S_{22}^M - e'_{33}}{e'_{23}e'_{32}}e'_{22}\right) - \left(\frac{S_{21}^M - e_{30}}{e_{10}e_{32}}\right)\left(\frac{S_{12}^M - e'_{03}}{e'_{23}e'_{01}}\right)e_{22}e'_{11}. \quad (12)$$

It should be noted that only 12 independent combinations of error parameters appear in these equations, hence the name "12 term error model." The 12 error terms are related to the 14 fundamental error parameters according to the following equations (error term=fundamental error parameter(s)):

EDF(forward directivity)=$e_{00}$ (13)

EXF(forward cross isolation)=$e_{30}$ (14)

ESF(forward source match)=$e_{11}$ (15)

ERF(forward reflection tracking)=$e_{10}*e_{01}$ (16)

ELF(forward load match)=$e_{22}$ (17)

ETF(forward transmission tracking)=$e_{10}*e_{32}$ (18)

EDR(reverse directivity)=$e'_{33}$ (19)

EXR(reverse cross isolation)=$e'_{03}$ (20)

ESR(reverse source match)=$e'_{22}$ (21)

ERR(reverse reflection tracking)=$e'_{23}*e'_{32}$ (22)

ELR(reverse load match)=$e'_{11}$ (23)

ETR(reverse transmission tracking)=$e'_{23}*e'_{01}$ (24)

The ideal objective of any calibration procedure is to store these forward and reverse error terms for every path of the DUT. As noted previously, the prior method used in this field requires a separate full calibration for each test path [n(n−1)/2] of the system, and thus this method is rarely used for multi-port measurement systems.

The present inventors have discovered, however, that by making two minor assumptions regarding the VNA test hardware (as shown in FIG. 1), the error terms for all possible test paths can be determined by calibrating only n/2 paths, where each test port participates in at least one calibration path. The calibration system decouples the error terms into error parameters that are local to each of the n test ports. The error terms for the paths that are not calibrated are then mathematically constructed using the local error parameters for the respective test ports associated with the path. This decoupling process includes a novel sign ambiguity determination method for calculating and resolving the square root of the forward and reverse reflection tracking terms (ETR, ERR), which are needed to effectively localize the forward and reverse transmission tracking terms (ETF, ERF).

Before turning to a detailed description of the preferred methodology (and calibration system), it is instructive to discuss the two assumptions mentioned above. The first assumption of the preferred calibration procedure is as follows—Assumption 1: with the exception of the leakage terms EXF, EXR, any fundamental error parameter in the error model is local to the port to which it refers, and is independent of the choice of the other port. This is termed the "independence assumption." Thus, for example, if test port P4 (58) were connected to Port 1 26 of the VNA, then its local error parameters, $e_{00}$, $e_{10}$, $e_{01}$, $e_{11}$, $e'_1$, and $e'_{11}$ would be independent of which of the other test ports P1–P3 was connected to Port 2 (28) of the analyzer. In like manner, when P4 (58) is connected to Port 2 (28) of the VNA (which can occur automatically by switching through the test matrix 30), the remaining error parameters $e_{22}$, $e_{32}$, $e'_{22}$, $e'_{32}$, $e'_{23}$ and $e'_{33}$ can also be localized to P4, such that they are independent of what other port is connected to Port 1 of the analyzer. In this manner, most of the error parameters can be localized to the respective test ports in the test port pair. This assumption is very reasonable because the test ports linked to Ports 1 and 2 of the analyzer are coupled by completely different sets of switches. The inventors have also verified this assumption by measurements on commercial test hardware.

If the test ports are independent in this sense, then a standard calibration procedure has a great deal of redundancy. It is, in part, by eliminating this redundancy that the number of required test port interconnections can be reduced. It should be noted that no particular assumptions are required for the leakage terms EXF, EXR. These terms are determined by transmission measurements with all test ports disconnected (and usually terminated). The instrument can therefore cycle through all the paths automatically and determine the leakage terms without manual intervention.

Equations (4–12) reveal an issue with this scheme that requires an additional assumption to reduce the number of full calibration steps to a minimum. This issue relates to the fact that the error parameters $e_{10}$, $e_{32}$, and $e'_{23}$, $e'_{01}$ do not appear individually, but in the combinations ETF ($e_{10}*e_{32}$), and ETR ($e'_{23}*e'_{01}$) which are referred to as "the transmission tracking terms." Indeed, no measurement on calibration standards alone can determine these error parameters in isolation.

This problem with the ETF and ETR terms leads to the second assumption—Assumption 2: reciprocity, which enables the decoupling of the transmission tracking terms into local error parameters by separating the products $e_{10}*e_{32}$ and $e'_{23}*e'_{01}$ into products of error parameters that are local to one or the other of the test ports. These local error parameters need not necessarily be equal to the fundamental error parameters $e_{10}$, $e_{32}$, $e'_{23}$ and $e'_{01}$. The second assumption is that the RF hardware components in the switch box 30 and in the network analyzer 10 are reciprocal. This assumption, which has been well verified by experiment, is very reasonable because non-reciprocal RF components such as isolators or circulators are not employed in such test equipment. As a consequence of the reciprocity assumption, it follows that the ratios $$\Gamma_F = \left(\frac{e_{01}}{e_{10}}\right) \text{ and } \Gamma_R = \left(\frac{e'_{32}}{e'_{23}}\right)$$

are independent of the particular test port (P1–P4). This is a weaker assumption than strict reciprocity (i.e., $e_{10}=e_{01}$ and $e''_{32}=e'_{23}$). Strict reciprocity is not generally valid because, in addition to hardware effects, the parameters $e_{10}$, $e_{01}$, $e'_{32}$ and $e'_{23}$ also include the effects of phase and amplitude offsets between the VNA samplers.

The ratios $\Gamma_F$, $\Gamma_R$ cannot be explicitly determined, but, being independent of the particular test port, cancel out in the final calculations. Having made this assumption, the fundamental error parameters ($e_{10}$, $e_{01}$, $e_{32}$, $e'_{23}$, $e'_{32}$ and $e'_{01}$) for a particular test port are given by:

$$e_{10} = \frac{\sqrt{ERF}}{\sqrt{\Gamma_F}}, e_{01} = \sqrt{\Gamma_F} * \sqrt{ERF} \quad (25)$$

$$e'_{23} = \frac{\sqrt{ERF}}{\sqrt{\Gamma_R}}, e'_{32} = \sqrt{\Gamma_R} * \sqrt{ERR} \quad (26)$$

$$e_{32} = \sqrt{\Gamma_F} * \frac{ETF}{\sqrt{ERR}} \quad (27)$$

$$e'_{01} = \sqrt{\Gamma_R} * \frac{ETR}{\sqrt{ERR}} \quad (28)$$

But, as noted above, it is not generally possible to explicitly determine $\Gamma_F$ and $\Gamma_R$. This is not a problem with the present invention, however, because in the construction of the error terms (specifically ETF and ETR) for the non-calibrated paths, the $\Gamma$ terms cancel out. Thus, the decoupling procedure only requires the computation of the separate parameters $$\sqrt{e_{10}*e_{01}} = \sqrt{ERF}, \sqrt{e'_{32}*e'_{23}} = \sqrt{ERR}, \bar{e}_{32} = \frac{ETF}{\sqrt{ERF}},$$

$$\text{and} \quad \bar{e}'_{01} = \frac{ETR}{\sqrt{ERR}},$$

which can be localized to one of the test ports in the test path. The parameters $\bar{e}_{32}$ and $\bar{e}'_{01}$ are identical to $e_{32}$ and $e'_{01}$, except that the $\Gamma$ terms are missing. Since these terms cancel out in the final equations (see equations 31 and 32, below), it is only necessary to determine the ratios defined by $\bar{e}_{32}$ and $\bar{e}'_{01}$ in order to properly construct the non-calibrated test paths.

However, these computations require the evaluation of the complex square root of the ERF and ERR terms. This square root operation is inherently ambiguous with respect to sign, and unless the signs of the roots are chosen consistently for all test ports, any subsequent measurements may be completely invalid. The preferred methodology of the present invention solves this sign ambiguity problem by first performing a linear extrapolation to zero frequency for the reflection tracking error term phase data for each test port, and then by calculating the magnitude and absolute phase of the term at a consistent intercept. By ensuring that the zero frequency intercepts are consistent (ideally identical) the ambiguity of the sign is resolved.

This preferred calibration procedure only requires that the test ports (P1–P4) be calibrated in pairs in such a way that each test port is included in at least one pair. The interconnection scheme could therefore be (P1, P2), (P3, P4) for the hypothetical four-port test system shown in FIG. 1, although any other physically convenient pairing could be used. Then, for each selected pair of test ports a full 12-term calibration procedure is performed. At each stage, calibration measurements are made with the ports of the network analyzer (Port 1, Port 2) connected to the test ports (P1–P4) in both possible senses. In addition, when the transmission measurements are made, reflection measurements are made of each test port in its terminated state. The total number of operations performed by the test technician is exactly the same as for a conventional 12-term calibration, but in this case the analyzer performs considerably more measurements on each calibration component.

The error terms for paths 1 and 3 (P1–P2, P3–P4) are then known from the actual measurements on these test ports. By decoupling the error terms associated with these measured test paths into local error parameters, which are associated with particular test ports by virtue of the independence assumption, each test port in any path can be treated independently of the others. Then, the error terms for the remaining paths (2, 4, 5 and 6) can be constructed from the localized error parameters for the two ports in the respective path. This procedure is described in more detail below.

Figure 4:
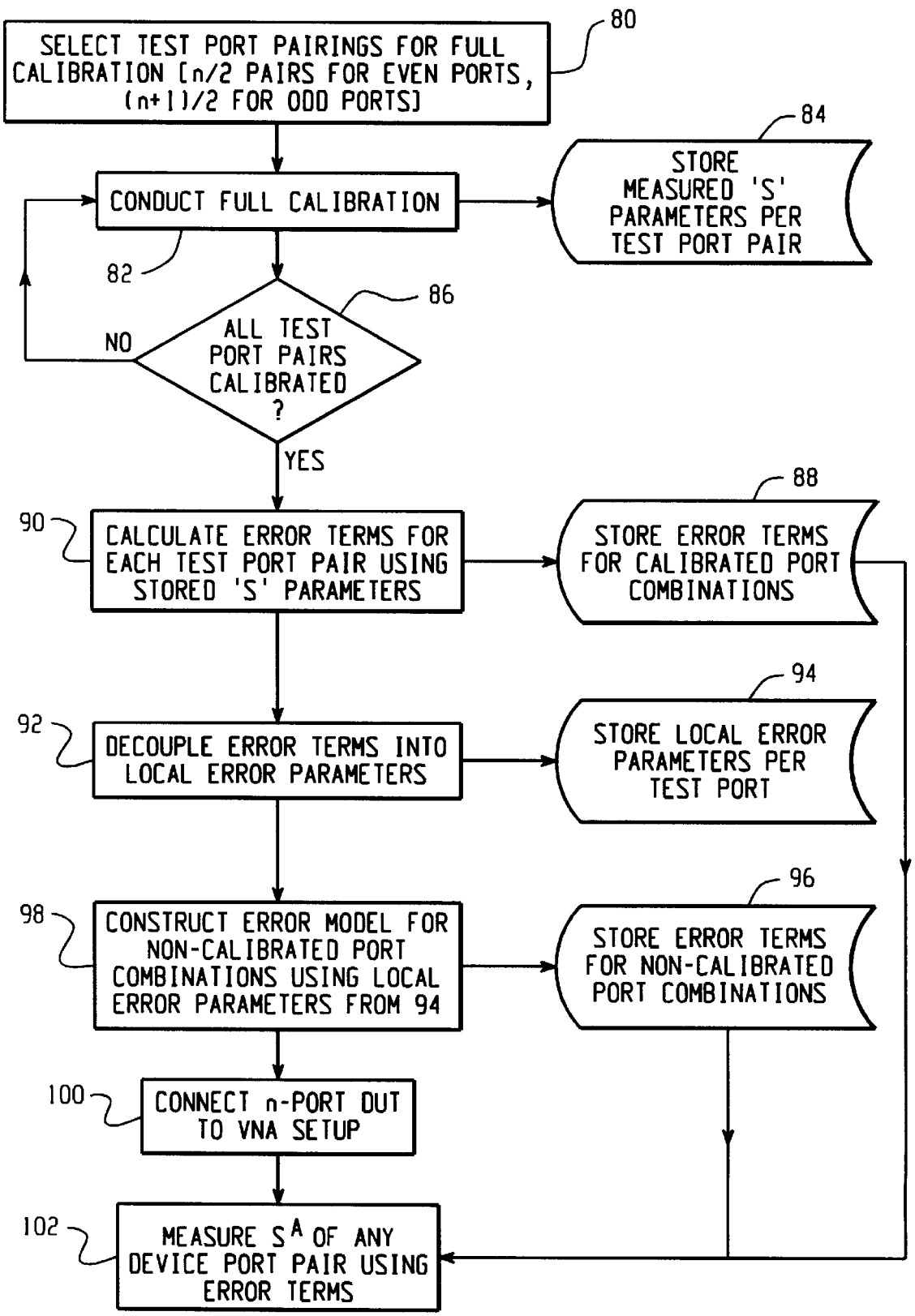
FIG. 4 is a flowchart of a preferred series of steps for calibrating an n-port S parameter measurement system such as shown in FIG. 1.
Figure 5:
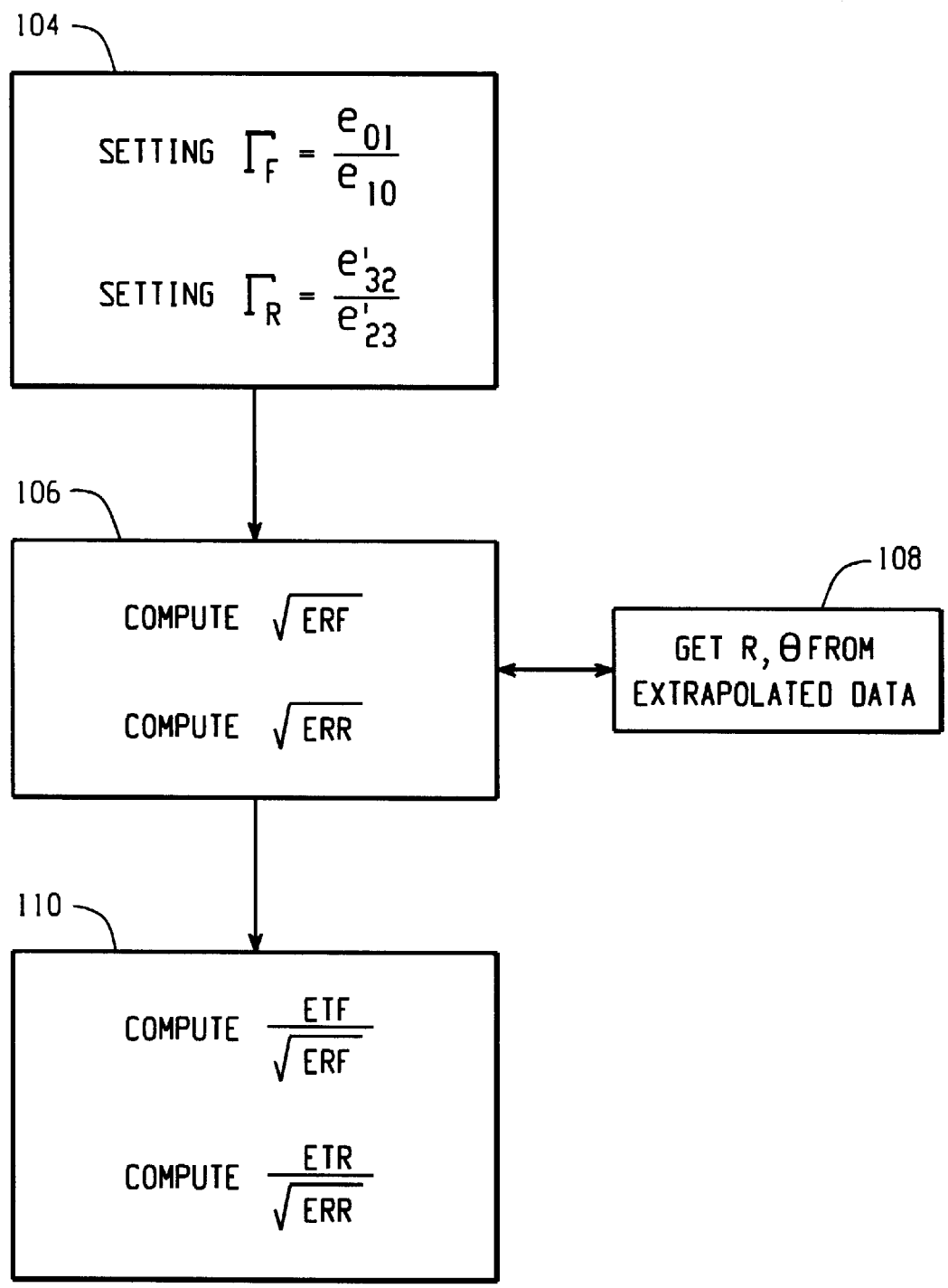
FIG. 5 is a flowchart of a preferred series of steps for decoupling the forward and reverse error tracking terms in the 12-term error model.
Figure 6:
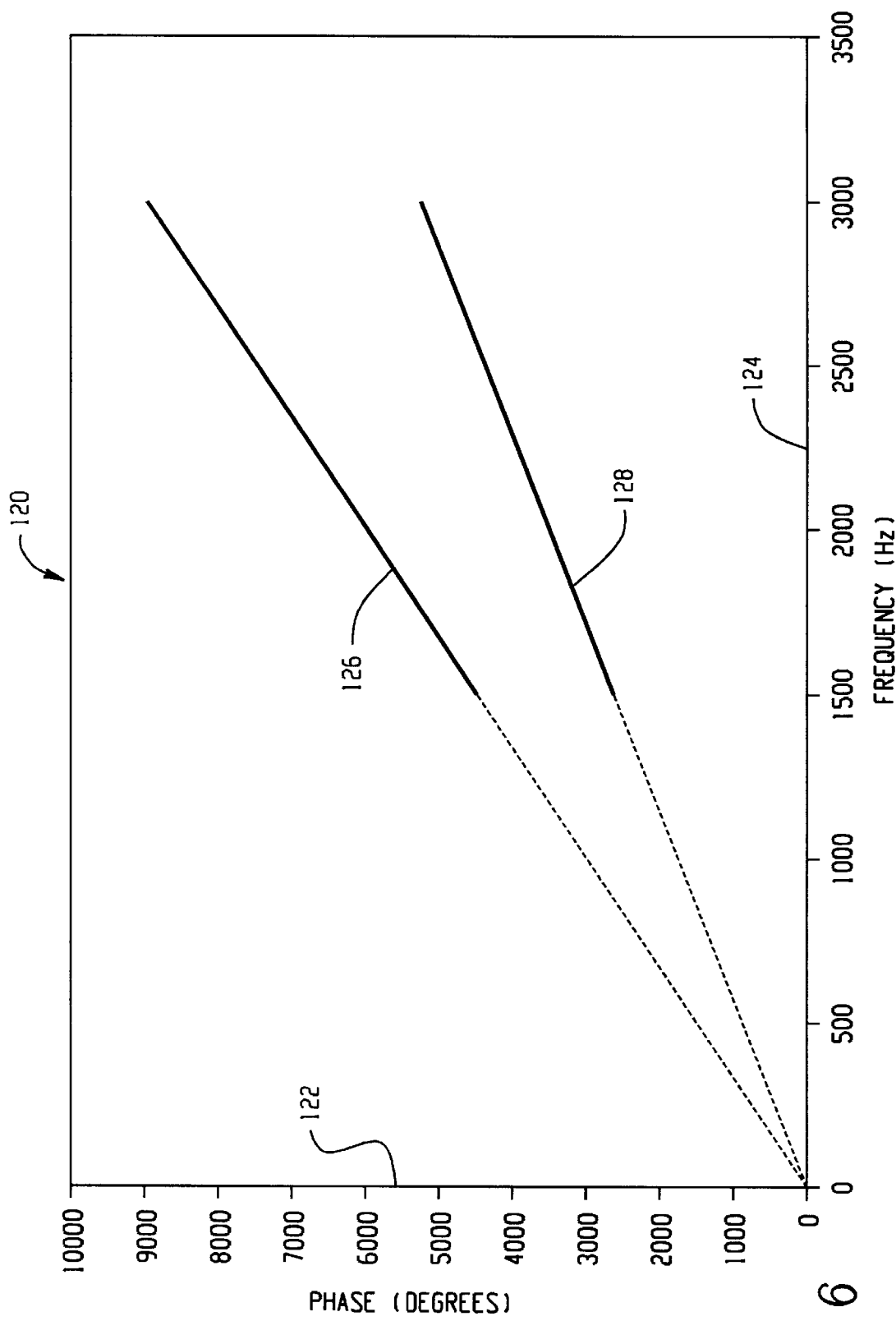
FIG. 6 is a plot showing the zero-frequency phase extrapolation step utilized by the methodology of the present invention to resolve the sign ambiguity in the square root calculation that results from decoupling the forward and reverse error tracking terms.

Turning now to the remaining drawing figures, FIGS. 4–6 describe in more detail the method steps carried out by an S parameter measurement system programmed to function according to the present invention. FIG. 4 is a flowchart of a preferred series of steps for calibrating an n-port S parameter measurement system such as shown in FIG. 1. FIG. 5 is a flowchart of a preferred series of steps for decoupling the forward and reverse error tracking terms in the 12-term error model. And FIG. 6 is a plot showing the zero-frequency phase extrapolation step utilized to resolve the sign ambiguity in the square root calculation of the forward and reverse reflection tracking terms.

The preferred method discussed herein is applicable to any RF measurements made using a VNA (or other equivalent device) for characterizing the S parameters of a DUT. For simplicity the discussion of the preferred method is limited to the 12-term error model shown in FIGS. 2 and 3, but it is equally valid for other error models. The invention is capable of many distinct implementations. It can be implemented as a method of operation. It can be implemented as a system or apparatus including computer software (or firmware) programming for executing the preferred method of operation. It can be implemented as an article of manufacture (i.e., a series of computer-implemented steps stored on a magnetic medium, such as a floppy disk, CD-ROM or other transportable storage device.) These are just some of the many implementations that the present invention may take.

The following discussion of the preferred methodology assumes that a hypothetical four-port DUT is connected to a VNA through a 2-to-4 switch matrix as shown in FIG. 1. This configuration allows Port 1 or Port 2 (26, 28) of the VNA to be switched to any one of the test ports P1–P4 (52–58). The four ports of the device under test (DUT) are designated J1–J4. During actual S parameter characterization (which follows calibration), these ports (J1–J4) are connected to the test ports (P1–P4).

To fully characterize the DUT, error data for each of the six paths J1–J2, J2–J3, J3–J4, J4–J1, J1–J3 and J2–J4 of the device is needed. Each path is characterized by two twelve-term error models, which are chosen for each of the two possible ways of connecting the chosen test ports (P1–P4) to the VNA 10. This would normally require twelve full two-port calibrations to be performed as shown in Table 1.0, set forth below. However, because the measurements for a given pair of test ports are performed automatically, both senses can be calibrated in one operation and thus, only six pairs of ports need to be connected in order to fully calibrate the system. Thus, according to the conventional methodologies, for an n-port system n(n−1)/2 such pairings are required.

TABLE 1.0

Conventional Calibration Path Connectivity for a Four-Port Device

| Test Ports | Switch to Port 1 of VNA | Switch to Port 2 of VNA |
| --- | --- | --- |
| P1-P2 | P1 | P2 |
| P2-P1 | P2 | P1 |
| P1-P3 | P1 | P3 |
| P3-P1 | P3 | P1 |
| P1-P4 | P1 | P4 |
| P4-P1 | P4 | P1 |
| P2-P3 | P2 | P3 |
| P3-P2 | P3 | P2 |
| P2-P4 | P2 | P4 |
| P4-P2 | P4 | P2 |
| P3-P4 | P3 | P4 |
| P4-P3 | P4 | P3 |

However, by using the n/2 calibration method described below, only four paths need to be calibrated as defined in Table 2.0. These four paths are calibrated using only n/2=2 connections, P1–P2 and P3–P4, since the VNA can automatically measure in both directions. In this case, the missing eight calibrations are constructed using error data from those taken. Note that for devices with an odd number of ports the required number of port pairings is (n+1)/2 rather than n/2.

TABLE 2.0

N/2 Calibration Path Connectivity for a Four Port Device

| Test Ports | Switch to Port 1 of VNA | Switch to Port 2 of VNA |
| --- | --- | --- |
| P1-P2 | P1 | P2 |
| P2-P1 | P2 | P1 |
| P3-P4 | P3 | P4 |
| P4-P3 | P4 | P3 |

Turning now to FIGS. 4 and 5, the preferred n/2 calibration methodology is described. This methodology is preferably implemented as software instructions stored in the memory 14 of the VNA 10. These software instructions can be installed into the VNA memory via a floppy disk or other transportable medium, or they may be permanently installed in the VNA memory, such as in a ROM, Flash ROM, EEPROM, or other type of memory device.

The first step of the method 80 is to select the desired n/2 test port pairings. Each test port must participate in at least one pairing. For an even-port DUT, such as the four-port device shown in FIG. 1, two test port pairings (4/2=2) are selected. For example, the test port pairings could be P1–P2 and P3–P4, although this selection of port pairings is arbitrary. If the hypothetical device had been a five-port device, then three test port pairings would be required (5+1)/2=3. Once the n/2 test port pairings are determined, then a standard full calibration is conducted on the pairings 82.

This full calibration step can be done according to several well-established and published techniques, such as SOLT (Short Open Load Through), LRM (Line Reflect Match) or TRL (Through Reflect Line), or can be done using any other suitable combination of calibration components. Regardless of technique used, each method relies upon measuring certain calibration components in order to solve the error contributions in the standard 12-term model (or whatever other model is being used). To solve for the 12 unknown quantities in these model equations, 12 independent measurements at the test ports must be made. A typical procedure involves reflection measurements on three known impedance standards at each of the two test ports (6 measurements), transmission and reflection measurements on a through connection with known properties (4 measurements), and transmission measurements with the test ports disconnected and terminated with matched loads (2 measurements).

For each test port pair that is fully calibrated, the measured S parameters are stored at step 84. This data can be stored in the memory 14 of the VNA 10, or it could be transferred to a PC or workstation that is controlling the calibration system. The full calibration process continues (86, 82) until each of the selected n/2 test port pairs is calibrated and the respective S parameters are stored 86.

Control of the calibration system then passes to step 90, in which the measured S parameters gathered during the calibration process (82) are used to calculate the error terms (EDF, ESF, ELF, EXF, ERF, ETF, EDR, ESR, ELR, EXR, ERR, and ETR) associated with each test port pair. These error terms are computed by solving the standard 12-term error model equations (4–12), and these values are then stored in the system at step 88.

Having calculated the error terms for the measured test port pairings at step 90, control of the calibration system passes to step 92, in which the error terms associated with the test port pairings are decoupled into error parameters that are localized to the individual test port to which they are associated by virtue of the independence assumption. These local error parameters are then stored per test port for use in constructing the error model for the non-measured paths.

There are two ways in which the error terms are decoupled from the port pair into localized error parameters associated with just one of the test ports. The first way relates to the transmission tracking terms (ETF, ETR), and is more thoroughly described below in connections with FIGS. 5 and 6. The second way (which is less complex than the first) relates to the remaining error terms. These terms are decoupled from the port pairing by disassociating the term from the port path that is calibrated and by associating the error parameters that comprise the term with one of the respective test ports that form the path.

For example, consider the test port pairing P1–P2, where P1 is connected to Port 1 of the analyzer and P2 is connected to Port 2 (Le., path 1.) For this configuration, the error terms EDF, ESF, ERF, ELF, EDR, ESR, ERR and ELR can be decoupled from the test path (path 1) into the local error parameters $e_{00}$, $e_{11}$, $e_{10}*e_{01}$, $e_{22}$, $e'_{33}$, $e'_{22}$, $e'_{23}*e'_{32}$ and $e'_{11}$ by disassociating these terms from the test port pairing (path 1), and associating the local parameters with the individual test ports (P1 or P2). In this example, since P1 is connected to Port 1 of the analyzer, then local parameters $e_{00}$, $e_{11}$, $e_{10}*e_{01}$ and $e'_{11}$ would be associated with test port P1 and local parameters $e_{22}$, $e'_{33}$, $e'_{23}*e'_{32}$ and $e'_{22}$ would be associated with test port P2. In this manner, the error terms that were coupled to and associated with the test port pairing can be decoupled from the pair into localized error parameters that are associated with just one test port of the pair.

Turning now to FIG. 5, a flowchart is set forth showing a preferred series of steps for decoupling the forward and reverse error tracking terms into local error parameters. This decoupling operation separates the error tracking terms into a product of localized error parameters as follows:

$$\sqrt{e_{10}*e_{01}} = \sqrt{ERF} \text{ and } \overline{e}'_{01} = \frac{ETR}{\sqrt{ERR}},$$

which are localized to one of the ports, and $$\sqrt{e'_{32}*e'_{23}} = \sqrt{ERR} \text{ and } \overline{e}_{32} = \frac{ETF}{\sqrt{ERF}},$$

which are localized to the other test port of the pair. As noted above, the parameters $\overline{e}_{32}$ and $\overline{e}'_{01}$ are identical to $e_{32}$ and $e'_{01}$, except that the $\Gamma$ terms are missing. However, as shown in equations 31 and 32, these terms cancel out, and thus it is only necessary to determine the ratios defined by $\overline{e}_{32}$ and $\overline{e}'_{01}$ in order to properly construct the non-calibrated test paths.

According to this method, it is first assumed that the test ports are reciprocal 104, i.e., the ratios $$\Gamma_R = \left(\frac{e'_{32}}{e'_{23}}\right) \text{ and } \Gamma_F = \left(\frac{e_{01}}{e_{10}}\right)$$

are independent of the test port since the RF test hardware is reciprocal. Having made this assumption, control of the system passes to step 106, in which the complex square root of the ERF and ERR terms is calculated using data from step 108 to resolve the sign ambiguity of these square root terms (step 108 is described in more detail below.) Having resolved the sign ambiguity of the square root of ERF and ERR, control passes to step 110, in which the $\overline{e}_{32}$ and $\overline{e}'_{01}$ error parameters are calculated according to the following equations:

$$\overline{e}_{32} = \frac{ETF}{\sqrt{ERF}}, \text{ and} \quad (29)$$

$$\overline{e}'_{01} = \frac{ETR}{\sqrt{ERR}}. \quad (30)$$

Having separated the error tracking terms into these localized parameters, the ETF and ETR terms for the non-calibrated test paths may be constructed in the following manner: (See, Table 3.0)

$$ETF = e_{10}*e_{32} = \sqrt{e_{10}*e_{01}} * \sqrt{\frac{e_{10}}{e_{01}}} * e_{32} \quad (31)$$

$$= \sqrt{e_{10}*e_{01}} * \frac{e_{32}}{\sqrt{\Gamma_F}} = \sqrt{e_{10}*e_{01}} * \overline{e}_{32},$$

where $\overline{e}_{32} = \frac{1}{\sqrt{\Gamma_F}} * e_{32} = \frac{ETF}{\sqrt{ERF}}$ and $$ETR = e'_{23}*e'_{01} = \sqrt{e'_{23}*e'_{32}} * \sqrt{\frac{e'_{23}}{e'_{32}}} * e'_{01} \quad (32)$$

$$= \sqrt{e'_{23}*e'_{32}} * \frac{e'_{01}}{\sqrt{\Gamma_R}} = \sqrt{e'_{23}*e'_{32}} * \overline{e}'_{01},$$

where $\overline{e}'_{01} = \frac{1}{\sqrt{\Gamma_R}} * e'_{01} = \frac{ETR}{\sqrt{ERR}},$ and where $$\sqrt{e_{10}*e_{01}} = \sqrt{ERF} \text{ and } \overline{e}'_{01} = \frac{ETR}{\sqrt{ERR}}$$

are local error parameters associated with one of the test ports in the path to be constructed and $$\sqrt{e'_{32}*e'_{23}} = \sqrt{ERR} \text{ and } \overline{e}_{32} = \frac{ETF}{\sqrt{ERF}}$$

are local error parameters associated with the other test port in the path to be constructed.

Because $e_{32}$ and $e'_{01}$ are local to particular test ports, and because $\Gamma_R$ and $\Gamma_F$ are independent of test port, it follows that $\overline{e}_{32}$ and $\overline{e}'_{01}$ are also local error parameters. Equations (31) and (32) thus express ETF and ETR as products of error parameters which can be explicitly determined and are localized to a particular test port.

The proper signs (+/−) for the $\sqrt{ERF}$ and $\sqrt{ERR}$ terms (which are computed in steps 106 and 108 of FIG. 5) are determined by unwrapping the phase data of these terms, and then extrapolating back to 0 Hz phase. FIG. 6 is a plot showing the zero-frequency phase extrapolation step. The X-axis of the plot 124 shows frequency in Hz, and the Y-axis shows phase, measured in degrees. The data plots 126, 128 show the ERF (or ERR) data for two test ports (as solid lines), and the extrapolated data as dashed lines.

These curves 126, 128 are extrapolated to 0 Hz using a straight line fit. Although such a straight-line fit is appropriate for a coaxial system, a more complex extrapolation could be employed for a waveguide or a mixed coaxial/waveguide system. The phase of ERF (or ERR) can be shifted in multiples of 360° without affecting the data. The offset (integer multiple of 360°) is arbitrarily chosen so that the 0 Hz intercept is in the range of −180° to +180°. With this choice of phase offset, the square root terms for ERF (or ERR) across all test ports are consistent, and errors associated with the + sign ambiguity in the square root operation are eliminated. Since the square root terms only appear as ratios in the final equations, the "absolute" phase is unimportant as long as the signs are consistent. For example, the signs of all the square root terms could be reversed without affecting the overall calculations.

From the plots 126, 128, the absolute phase of ERF or ERR can be extracted. By knowing the absolute phase of the error term at the frequency of choice, the square root can be taken using the following expression in complex polar notation:

$$(ERF_j)^{1/2} = R_j^{1/2} * e^{(i\theta j/2)}, j=1,2,3,4,5 \ldots, \textit{nth point} \quad (33)$$

$$(ERR_j)^{1/2} = R_j^{1/2} * e^{(i\theta j/2)}, j=1,2,3,4,5 \ldots, \textit{nth point} \quad (34)$$

where R=the modulus or magnitude of the complex number, and 0=the argument or phase of the complex number. This information is computed at step 108.

Having decoupled the transmission error tracking terms associated with the test port pairings into local error parameters, these parameters can then be associated with a specific test port in a similar manner as the other error terms. Going back to the example from above (test port pairing P1–P2 connected to ports 1 and 2 of the analyzer, respectively), error parameter $\bar{e}'_{01}$ would be localized to test port P1 (since it is connected to Port 1 of the VNA), and parameter $\bar{e}_{32}$ would be associated with test port P2.

Turning back to FIG. 4, once the error terms have been decoupled into their local error parameters, control of the system passes to step 98. In this step 98, the error model for each of the non-measured paths is constructed using the error parameters stored in step 94 for the individual test ports. For example, using the calibration data from path 1 (P1–P2) and path 3 (P4–P3), the error model for path 5 (P1–P3) can be constructed as shown in Table 3.0. The isolation terms (EXF, EXR) between test ports can be ignored in most applications. If the isolation terms are required, then they are measured with the test ports disconnected, so no additional calibration is needed.

TABLE 3.0

Summary of Error Term Construction

| P1–P2 | P4–P3 | P1–P3 |
|---|---|---|
| $EDF_{(P1-P2)}$ | $EDF_{(P4-P3)}$ | $EDF_{(P1-P3)} = e_{00(P1)}$ |
| $ERF_{(P1-P2)}$ | $ERF_{(P4-P3)}$ | $ERF_{(P1-P3)} = e_{10(P1)} * e_{01(P1)}$ |
| $ESF_{(P1-P2)}$ | $ESF_{(P4-P3)}$ | $ESF_{(P1-P3)} = e_{11(P1)}$ |
| $ELF_{(P1-P2)}$ | $ELF_{(P4-P3)}$ | $ELF_{(P1-P3)} = e_{22(P3)}$ |
| $ETF_{(P1-P2)}$ | $ETF_{(P4-P3)}$ | $ETF_{(P1-P3)} = \sqrt{e_{10}e_{01}}\,(P1) * \bar{e}_{32(P3)}$ |
| $EDR_{(P1-P2)}$ | $EDR_{(P4-P3)}$ | $EDR_{(P1-P3)} = e'_{33(P3)}$ |
| $ERR_{(P1-P2)}$ | $ERR_{(P4-P3)}$ | $ERR_{(P1-P3)} = e'_{23(P3)} * e'_{32(P3)}$ |
| $ESR_{(P1-P2)}$ | $ESR_{(P4-P3)}$ | $ESR_{(P1-P3)} = e'_{22(P3)}$ |
| $ELR_{(P1-P2)}$ | $ELR_{(P4-P3)}$ | $ELR_{(P1-P3)} = e'_{11(P1)}$ |
| $ETR_{(P1-P2)}$ | $ETR_{(P4-P3)}$ | $ETR_{(P1-P3)} = \sqrt{e'_{23}e'_{32}}\,(P3) * \bar{e}'_{01(P1)}$ |

This error term construction process is made possible by virtue of the independence and reciprocity assumptions regarding the test hardware. These assumptions enable the decoupling of the error terms into local error parameters and the independent treatment of each test port regardless of what other port it is connected to. Thus, test paths that are not measured can nevertheless be calibrated using the stored error parameters associated with the individual test ports.

Once the error model terms for the non-measured paths are constructed, they are stored in step 96. In a similar manner to that shown in Table 3.0, all other possible port combinations (or paths) that are not directly calibrated are constructed according to the combination of test ports given in Table 3.1. Note that each path is constructed using only the n/2=2 (in this case) combinations of test ports (P1–P2) and (P3–P4).

TABLE 3.1

Summary of Error Term Construction for Complete Data Set

| Required Path to Construct | Calibration Data with Port 1 of VNA as a Source | Calibration Data with Port 2 of VNA as a Receiver |
|---|---|---|
| P1-P3 | P1-P2 | P4-P3 |
| P3-P1 | P3-P4 | P2-P1 |
| P1-P4 | P1-P2 | P3-P4 |
| P4-P1 | P4-P3 | P2-P1 |
| P2-P3 | P2-P1 | P4-P3 |
| P3-P2 | P3-P4 | P1-P2 |
| P2-P4 | P2-P1 | P3-P4 |
| P4-P2 | P4-P3 | P1-P2 |

Once the error terms for all the possible paths have been constructed, control of the system passes to step 100, where a DUT 50 is attached to the system for actual S parameter measurements. And finally, at step 102, these measured S parameters ($S^M$) for the DUT 50 can be corrected to give the actual S parameters ($S^A$) by solving the standard equations given above (4–12) using the error data stored at steps 88 and 96. In this manner, the actual S parameters of any n-port DUT can be accurately determined using a calibration methodology that requires only n/2 full calibration measurements for the VNA test setup.

This preferred methodology provides many advantages over presently known calibration methods for measuring the S parameters of a multi-port DUT. Foremost among these many advantages is that it allows full calibration of an n-port test system with at most n/2 interconnections between test ports. This, in turn, permits true n-port error correction. Other advantages of using the preferred methodology include: (1) reduced cable bending and compatibility with rigid and semi-rigid cable systems; (2) the system error data is localized to each particular test port; (3) allows for calibration of systems with mixed connector types (i.e., coaxial and waveguide) without relying on standard adapter models or adapter removal techniques; and (4) the technique allows for full-automation of the calibration process by allowing a single connection of any pair of test ports in conjunction with third party electronic calibration kits and switch matrix test sets.

A special case of the n/2 calibration methodology discussed above reduces the number of full calibrations even further if a four-sampler VNA is used. With such a setup, it is possible to calibrate the system so that only one full two-port calibration is needed, and n−2 reflection calibrations. This technique relies on the additional assumption that the forward error parameters are equivalent to the reverse "primed" error parameters (i.e., $e_{10}=e'_{10}$). This condition is only met when a four-sampler VNA is employed, such as shown in FIG. 1, whereas the more general n/2 method is applicable to any VNA configuration. In both the n/2 method and this four-sampler method, all calibrations are performed with each of the test ports connected to each of the two VNA ports. In order to clarify the technique, the DUT 50 shown in FIG. 1 is assigned three arbitrary interface types as defined in Table 4.0 below.

TABLE 4.0

DUT Connector Configuration and Type

| DUT Port | Connector Type |
|---|---|
| J1 | 3.5 mm |
| J2 | Waveguide |
| J3 | TNC |
| J4 | Waveguide - Same size as J2 |

Given this configuration, the VNA system can be calibrated by performing a full two-port calibration between test ports P2–P4 and two reflection calibrations, one on test port P1 using 3.5 mm calibration standards and one on test port P3 using TNC calibration standards. The full twelve-term error models can then be constructed from the error terms gathered during the calibration of the system. In the example given in Table 4.1 (below) test ports P1 and P3 (52, 56) are calibrated using a single reflection calibration, and test ports P2–P4 (Path 6) are calibrated using a full two-port calibration. In similar fashion to the n/2 method, during calibration of the system, the error parameters for each of the ports are determined by decoupling and localizing the parameters so that each port can be treated independently from the others.

Using the equations set forth in Table 4.1, below, the error terms for path P1–P3 can be constructed using the measured error parameters from the partial calibrations of ports 1 and 3, and the full calibration of path P2–P4. In a similar manner the four remaining combinations of test ports P1–P2, P1–P4, P2–P3 and P3–P4 can be constructed.

TABLE 4.1

Example of Error Term Construction for P1–P3

| Port 1 as Source P1 | Port 2 as Source P3 | Path P2–P4 P2–P4 | P1–P3 Constructed Error Terms P1–P3 |
|---|---|---|---|
| $EDF_{(P1)}$ | $EDF_{(P3)}$ | $EDF_{(P2-P4)}$ | $EDF_{(P1-P3)} = e_{00(P1)}$ |
| $ERF_{(P1)}$ | $ERF_{(P3)}$ | $ERF_{(P2-P4)}$ | $ERF_{(P1-P3)} = e_{10(P1)} * e_{01(P1)}$ |
| $ESF_{(P1)}$ | $ESF_{(P3)}$ | $ESF_{(P2-P4)}$ | $ESF_{(P1-P3)} = e_{11(P1)}$ |
| | | $ELF_{(P2-P4)}$ | $ELF_{(P1-P3)} = e'_{22(P3)}$ |
| | | $ETF_{(P2-P4)}$ | $ETF_{(P1-P3)} = \sqrt{e_{10}e_{01}}\,(P1) * \sqrt{e'_{23}e'_{32}}\,(P3) * K_f$ |
| | | $EDR_{(P2-P4)}$ | $EDR_{(P1-P3)} = e'_{33(P3)}$ |
| | | $ERR_{(P2-P4)}$ | $ERR_{(P1-P3)} = e'_{23(P3)} * e'_{32(P3)}$ |
| | | $ESR_{(P2-P4)}$ | $ESR_{(P1-P3)} = e'_{22(P3)}$ |
| | | $ELR_{(P2-P4)}$ | $ELR_{(P1-P3)} = e_{11(P1)}$ |
| | | $ETR_{(P2-P4)}$ | $ETR_{(P1-P3)} = \sqrt{e_{10}e_{01}}\,(P1) * \sqrt{e'_{23}e'_{32}}\,(P3) * K_r$ | where (35)

$$K_f = \frac{(e_{10}e_{32})_{(P2-P4)}}{\sqrt{(e_{10}e_{01})(e'_{23}e'_{32})}_{(P2-P4)}} \text{ and}$$

$$K_r = \frac{(e'_{23}e'_{01})_{(P2-P4)}}{\sqrt{(e_{10}e_{01})(e'_{23}e'_{32})}_{(P2-P4)}} \quad (36)$$

Although $K_f$ and $K_r$ are calculated based on error parameters from P2–P4 they are, in fact, independent of the test ports they are measured from and can be applied universally to all of the other test ports. In this manner an n-port system can be calibrated using one full two-port calibration and n−2 reflection calibrations, which is again a significant reduction from the n/2 case.

The preferred embodiments described above are presented only by way of example and are not meant to limit the scope of the present invention, which is defined by the claims. Other elements and steps could be used in place of those shown.

What is claimed:

1. A method of calibrating a scattering (S) parameter measurement system to characterize a multi-port device having n ports, wherein n is greater than or equal to 2, and the S parameter measurement system has at least n test ports, the method comprising the steps of:

selecting n/2 test port pairs of the S parameter measurement system by arbitrarily assigning each of the n test ports to at least one of the n/2 test port pairs, wherein each of the n/2 test port pairs is characterized by an error model comprising a plurality of error terms;

conducting an S parameter calibration on each of the n/2 test port pairs and storing the S parameter measurements resulting from the calibrations in a memory associated with the S parameter measurement system;

calculating the error terms of the error model for each of the n/2 test port pairs using the S parameter measurements taken during the calibrations, and storing these error terms in the memory associated with the S parameter measurement system;

decoupling the error terms associated with the n/2 test port pairs into a plurality of constituent error parameters that are local to the n test ports of the n/2 test port pairs, and storing these local error parameters in the memory associated with the S parameter measurement system; and constructing an error model for each of the test port pairs that were not selected for calibration in the selecting step using the local error parameters for the n test ports from the decoupling step, and storing the associated error terms in the memory of the S parameter measurement system.

2. The method of claim 1, further comprising the steps of:

connecting an n-port device under test (DUT) to the test ports of the S parameter measurement system;

measuring the S parameters of the DUT; and calculating the S parameters of the DUT using the stored error terms.

3. The method of claim 1, wherein the method steps are implemented by computer software instructions stored on a transportable computer-readable medium.

4. The method of claim 1, wherein the calibrations are conducted using the short open load through method, the line reflect match method, or the through reflect line method.

5. The method of claim 1, wherein the memory is flash ROM, EEPROM or EPROM.

6. The method of claim 1, wherein (n+1)/2 port pairs are selected for full calibration instead of n/2 if the multi-port device has an odd number of ports.

7. The method of claim 1, wherein the S parameter measurement system includes a vector network analyzer.

8. The method of claim 7, wherein the vector network analyzer includes the memory for storing the error terms and parameters for the test port pairs.

9. The method of claim 7, wherein the vector network analyzer is a two-port analyzer.

10. The method of claim 9, wherein the two-port vector network analyzer is coupled to the n test ports via a 2-to-n switch matrix test set.

11. The method of claim 7, wherein the method steps are implemented by computer software instructions stored in a memory within the vector network analyzer.

12. The method of claim 7, wherein the vector network analyzer is controlled by an external computer system.

13. The method of claim 12, wherein the method steps are implemented by computer software instructions stored in a memory within the computer system.

14. The method of claim 1, wherein the error model for the test port pairs is the standard 12-term error model characterized by the equations:

$$S_{11}^M = e_{00} + (e_{10}e_{01}) \frac{S_{11}^A - e_{22}|S^A|}{1 - e_{11}S_{11}^A - e_{22}S_{22}^A + e_{11}e_{22}|S^A|},$$

$$S_{21}^M = e_{30} + (e_{10}e_{32}) \frac{S_{21}^A}{1 - e_{11}S_{11}^A - e_{22}S_{22}^A + e_{11}e_{22}|S^A|},$$

$$S_{12}^M = e'_{03} + (e'_{23}e'_{01}) \frac{S_{21}^A}{1 - e'_{11}S_{11}^A - e'_{22}S_{22}^A + e'_{11}e'_{22}|S^A|},$$

and $$S_{22}^M = e'_{33} + (e'_{23}e'_{32})S_{22}^A - \frac{e'_{11}|S^A|}{1 - e'_{11}S_{11}^A - e'_{22}S_{22}^A + e'_{11}e'_{22}|S^A|},$$

wherein $|S^A|$ is the determinant of the matrix $S^A$.

15. The method of claim 14, wherein the error model includes forward and reverse error tracking terms that are characterized by the equations:

$ERF$(forward reflection tracking)$=e_{10}*e_{01}$, $ETF$(forward transmission tracking)$=e_{10}*e_{32}$, $ERR$(reverse reflection tracking)$=e'_{23}*e'_{32}$, and $ETR$(reverse transmission tracking)$=e'_{23}*e'_{01}$.

16. The method of claim 15, wherein the decoupling step further comprises the steps of:

setting $\Gamma_F=$ $$\Gamma_F = \left(\frac{e_{01}}{e_{10}}\right) \text{ and } \Gamma_R = \left(\frac{e'_{32}}{e'_{23}}\right),$$

where $\Gamma_F$ and $\Gamma_R$ are independent of test port;
computing the complex square roots of ERF and ERR and resolving the sign of these error terms;
computing $$\frac{ETF}{\sqrt{ERF}};$$

and
computing $$\frac{ETR}{\sqrt{ERR}}.$$

17. The method of claim 16 wherein the resolving step further comprises the steps of:
extrapolating the phase data of the reflection tracking terms to a common intercept at zero Hz;
determining the absolute phase of the extrapolated phase data at the common intercept; and
calculating √ERF and √ERR with consistent treatment of the sign of the complex square root using the equations:

$\sqrt{ERF}=R^{1/2}*e^{(i\theta/2)}$, and $\sqrt{ERR}=R^{1/2}*e^{(i\theta/2)}$, wherein R is the modulus or magnitude and θ is the absolute phase of ERF or ERR.

18. The method of claim 16, wherein the resolving step further comprises the steps of:
extrapolating the error tracking terms to zero Hz; and
consistently calculating the sign of the complex square root of the error tracking terms by determining the magnitude and absolute phase of the extrapolated data at zero Hz.

19. The method of claim 15, wherein the decoupling step farther comprises the steps of:
assuming that the RF components of the S parameter measurement system are reciprocal; and
separating ETF and ETR into a product of local error parameters.

20. The method of claim 19, wherein the local error parameters include:

$$\sqrt{e_{10}*e_{01}} = \sqrt{ERF},$$

$$\overline{e}'_{01} = \frac{ETR}{\sqrt{ERR}},$$

$$\sqrt{e'_{32}*e'_{23}} = \sqrt{ERR}, \text{ and}$$

$$\overline{e}_{32} = \frac{ETF}{\sqrt{ERF}}.$$

21. A method of calibrating an S parameter measurement system having n test ports, wherein a test path between any two test ports is characterized by an error model having a plurality of error terms, the method comprising the steps of:
pairing the n test ports to form n/2 test paths, wherein each of the n test ports is included in at least one of the n/2 test paths;

calibrating the n/2 test paths to determine the error terms of the error model for each calibrated test path;

decoupling the error terms of the n/2 test paths into a plurality of constituent error parameters that are localized to one of the test ports in the pair of test ports that comprise each test path; and constructing the error terms for the non-calibrated test paths using the local error parameters for each of the test ports in each of the non-calibrated test paths.

22. The method of claim 21, further comprising the step of storing the error terms in a memory associated with the S parameter measurement system.

23. The method of claim 21, further comprising the steps of:

connecting an n-port device under test (DUT) to the test ports of the S parameter measurement system;

measuring the S parameters of the DUT; and calculating the S parameters of the DUT using the calibrated and constructed error terms.

24. The method of claim 21, wherein the error model for the test paths is the standard 12-term error model characterized by the equations:

$$S_{11}^M = e_{00} + (e_{10}e_{01})\frac{S_{11}^A - e_{22}|S^A|}{1 - e_{11}S_{11}^A - e_{22}S_{22}^A + e_{11}e_{22}|S^A|},$$

$$S_{21}^M = e_{30} + (e_{10}e_{32})\frac{S_{21}^A}{1 - e_{11}S_{11}^A - e_{22}S_{22}^A + e_{11}e_{22}|S^A|},$$

$$S_{12}^M = e_{03}' + (e_{23}'e_{01}')\frac{S_{21}^A}{1 - e_{11}'S_{11}^A - e_{22}'S_{22}^A + e_{11}'e_{22}'|S^A|},$$

and $$S_{22}^M = e_{33}' + (e_{23}'e_{32}')S_{22}^A - \frac{e_{11}'|S^A|}{1 - e_{11}'S_{11}^A - e_{22}'S_{22}^A + e_{11}'e_{22}'|S^A|},$$

wherein $|S^A|$ is the determinant of the matrix $S^A$.

25. The method of claim 24, wherein the error model includes forward and reverse error tracking terms that are characterized by the equations:

ERF(forward reflection tracking)=$e_{10}*e_{01}$,

ETF(forward transmission tracking)=$e_{10}*e_{32}$,

ERR(reverse reflection tracking)=$e'_{23}*e'_{32}$, and

ETR(reverse transmission tracking)=$e'_{23}*e'_{01}$.

26. The method of claim 25, wherein the decoupling step further comprises the steps of:

assuming that the RF components of the S parameter measurement system are reciprocal; and separating ETF and ETR into a product of local error parameters.

27. The method of claim 26, wherein the local error parameters include:

$$\sqrt{e_{10}*e_{01}} = \sqrt{ERF},$$

$$\bar{e}'_{01} = \frac{ETR}{\sqrt{ERR}},$$

$$\sqrt{e'_{32}*e'_{23}} = \sqrt{ERR}, \text{ and}$$

$$\bar{e}_{32} = \frac{ETF}{\sqrt{ERF}}.$$

28. The method of claim 25, wherein the decoupling step further comprises the steps of:

setting $$\Gamma_F = \left(\frac{e_{01}}{e_{10}}\right) \text{ and } \Gamma_R = \left(\frac{e'_{32}}{e'_{23}}\right),$$

where $\Gamma_F$ and ram are independent of test port;

computing the complex square roots of ERF and ERR and resolving the sign of these error terms;

computing $$\frac{ETF}{\sqrt{ERF}};$$

and computing $$\frac{ETR}{\sqrt{ERR}}.$$

29. The method of claim 28, wherein the resolving step further comprises the steps of:

extrapolating the phase data of the error tracking terms to a common intercept at zero Hz;

determining the absolute phase of the extrapolated phase data at the common intercept; and calculating √ERF and √ERR with consistent treatment of the sign of the complex square root using the equations:

√ERF=$R^{1/2}*e^{(i\theta/2)}$, wherein

√ERR=$R^{1/2}*e^{(i\theta/2)}$, wherein

R is the modulus or magnitude and θ is the absolute phase of ERF or ERR.

30. The method of claim 28, wherein the resolving step further comprises the steps of:

extrapolating the error tracking terms to zero Hz; and consistently calculating the sign of the complex square root of the reflection tracking terms by determining the magnitude and absolute phase of the extrapolated data at zero Hz.

31. A method of calibrating a vector network analyzer test system including a two-port vector network analyzer coupled to a 2-to-n switch matrix test set having two input ports coupled to the two ports of the vector network analyzer and n test ports, the method comprising the steps of:

selecting $n/2$ test paths for calibration from the $n(n-1)/2$ possible test paths through the test system, each of the n test ports participating in at least one of the selected $n/2$ test paths, wherein each test path through the test system is characterized by an error model including a plurality of error terms;

calibrating the selected $n/2$ test paths and measuring S parameters for each of these selected test paths;

calculating the error terms for the selected $n/2$ test paths from the measured S parameters;

decoupling the error terms into one or more error parameters that are local to one of the test ports; and constructing the error terms for the test paths that were not selected for calibration using the local error parameters for the test ports.

* * * * *

UNITED STATES PATENT AND TRADEMARK OFFICE
CERTIFICATE OF CORRECTION

PATENT NO. : 6,300,775 B1  
DATED : October 9, 2001  
INVENTOR(S) : Robert Peach, Nicholas Svensson and Thai Vo It is certified that error appears in the above-identified patent and that said Letters Patent is hereby corrected as shown below:

Column 21,
Line 50, change 
$$" S_{22}^M = e'_{33} + (e'_{23}e'_{32})\frac{e'_{11}|S^A|}{1-e'_{11}S_{11}^A - e'_{22}S_{22}^A + e'_{11}e'_{22}|S^A|} "$$ to
$$-- S_{22}^M = e'_{33} + (e'_{23}e'_{32})\frac{S_{22}^A - e'_{11}|S^A|}{1-e'_{11}S_{11}^A - e'_{22}S_{22}^A + e'_{11}e'_{22}|S^A|} --$$

Column 23,
Line 35, change 
$$" S_{22}^M = e'_{33} + (e'_{23}e'_{32})\frac{e'_{11}|S^A|}{1-e'_{11}S_{11}^A - e'_{22}S_{22}^A + e'_{11}e'_{22}|S^A|} "$$ to
$$-- S_{22}^M = e'_{33} + (e'_{23}e'_{32})\frac{S_{22}^A - e'_{11}|S^A|}{1-e'_{11}S_{11}^A - e'_{22}S_{22}^A + e'_{11}e'_{22}|S^A|} --$$

Column 24,
Line 16, change "ram" to -- $\Gamma_R$ --

Signed and Sealed this

Ninth Day of July, 2002

Attest:

Attesting Officer

JAMES E. ROGAN  
Director of the United States Patent and Trademark Office